United States Patent
Eifert et al.

(10) Patent No.: US 11,573,271 B1
(45) Date of Patent: Feb. 7, 2023

(54) BATTERY FAULT DETECTION

(71) Applicant: Ford Global Technologies, LLC, Dearborn, MI (US)

(72) Inventors: Mark Eifert, Park Ridge, IL (US); Pankaj Kumar, Canton, MI (US); Matthew Loiselle, LaSalle, MI (US); Timothy Rampiaray, Southfield, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 17/411,945

(22) Filed: Aug. 25, 2021

(51) Int. Cl.
*G01R 31/367* (2019.01)
*G01R 31/36* (2020.01)
*G01R 31/392* (2019.01)
*G06N 20/00* (2019.01)

(52) U.S. Cl.
CPC ....... *G01R 31/367* (2019.01); *G01R 31/3646* (2019.01); *G01R 31/392* (2019.01); *G06N 20/00* (2019.01)

(58) Field of Classification Search
CPC ................ G01R 31/367; G01R 31/392; G01R 31/3646; G06N 20/00
See application file for complete search history.

(56) References Cited

U.S. PATENT DOCUMENTS

| | | |
|---|---|---|
| 8,332,342 B1 | 12/2012 | Saha et al. |
| 8,725,456 B1 | 5/2014 | Saha et al. |
| 11,130,422 B1* | 9/2021 | Goldfarb ................. B63B 79/15 |
| 2019/0176639 A1* | 6/2019 | Kumar .................. B60L 3/0046 |
| 2020/0017117 A1* | 1/2020 | Milton .................. B60W 50/02 |
| 2020/0327033 A1* | 10/2020 | Bazzi .................... G05B 23/024 |
| 2022/0065940 A1* | 3/2022 | Sudarsan ............. G01R 31/392 |
| 2022/0074993 A1* | 3/2022 | Aykol ..................... G06F 30/15 |

FOREIGN PATENT DOCUMENTS

CN 106168799 A 11/2016

OTHER PUBLICATIONS

Anthony Barre et al., "Statistical Analysis for Understanding and Predicting Battery Degradations in Real-Life Electric Vehicle Use", https://hal.archives-ouvertes.fr/hal-01071585, May 7, 2019, 40 pgs.
Xi Chen et al., "Beyond Expert-Level Performance for Rechargeable Batteries by Unsupervised Machine Learning", Advanced Intelligent Systems, vol. 1, Issue 8, Oct. 6, 2019, 28 pgs.

(Continued)

*Primary Examiner* — Raymond L Nimox
(74) *Attorney, Agent, or Firm* — Frank Lollo; Brooks Kushman P.C.

(57) ABSTRACT

A control system, responsive to receiving values of one or more parameters of a battery of a vehicle for a particular time in service, generates via a machine learning determination a level of confidence at which the values of the one or more parameters of the battery match values of one or more parameters of a set of batteries for a same time in service, and responsive to the level exceeding a predefined threshold, causes a mitigation action to be implemented.

20 Claims, 8 Drawing Sheets

(56) References Cited

OTHER PUBLICATIONS

Shan Zhu et al., "Predicting Battery Life With Early Cyclic Data by Machine Learning", Energy Storage, 2019, wileyonlinelibrary.com/journal/est2, 5 pgs.

Zhi-Hao Wang et al., "A Prediction Method for Voltage and Lifetime of Lead-Acid Battery by Using Machine Learning", Energy Exploration & Exploitation, 2020, vol. 38, pp. 310-329.

"Battery Life Estimator", Argonne National Laboratory, Argonne, LLC, May 7, 2021, 2 pgs.

* cited by examiner

BATTERY FAULT DETECTION

TECHNICAL FIELD

This disclosure relates to batteries and measurements related thereto.

BACKGROUND

Lead-acid batteries are used in vehicles for electrical energy storage at a 12V level for starting the vehicle and for powering electrical functions while the primary power source is not active. The primary power source may be an alternator in a conventional vehicle with a combustion engine. It may be another form of electric machine or a DC/DC-converter in a hybridized or electric vehicle. It may also be a fuel cell. The primary power source may be inactive when the vehicle is parked or during stop-start operation.

A number of different types of lead-acid batteries are used for automotive applications. The types include AGM (Absorbent Glass Mat) and flooded batteries. A battery type and size is chosen for each vehicle in order to ensure that a high percentage of batteries that are installed achieve a targeted life expectancy. However, some batteries may not achieve the target, because the vehicle for example is operated in unexpected ways.

SUMMARY

A control system includes one or more processors that, responsive to receiving values of one or more parameters of a battery of a vehicle for a particular time in service, generate via a machine learning determination a level of confidence at which the values of the one or more parameters of the battery match values of one or more parameters of a set of batteries for a same time in service, and responsive to the level exceeding a predefined threshold, cause a mitigation action to be implemented. A value of the predefined threshold depends on the mitigation action.

A battery management system includes one or more processors that output an alert for a vehicle responsive to a machine learning determination that values of one or more parameters of a battery of the vehicle for a particular time in service match values of one or more parameters of a set of batteries for a same time in service with a level of confidence that exceeds a predefined threshold, and preclude output of the alert responsive to a machine learning determination that the values of the one or more parameters of the battery match the values of the one or more parameters of the set with a level of confidence that does not exceed the predefined threshold.

A method includes causing a mitigation action for a vehicle to be implemented responsive to a machine learning determination that values of one or more parameters of a battery of the vehicle for a particular time in service match values of one or more parameters of a set of batteries for a same time in service with a level of confidence that exceeds a predefined threshold.

DETAILED DESCRIPTION

Figure 1:
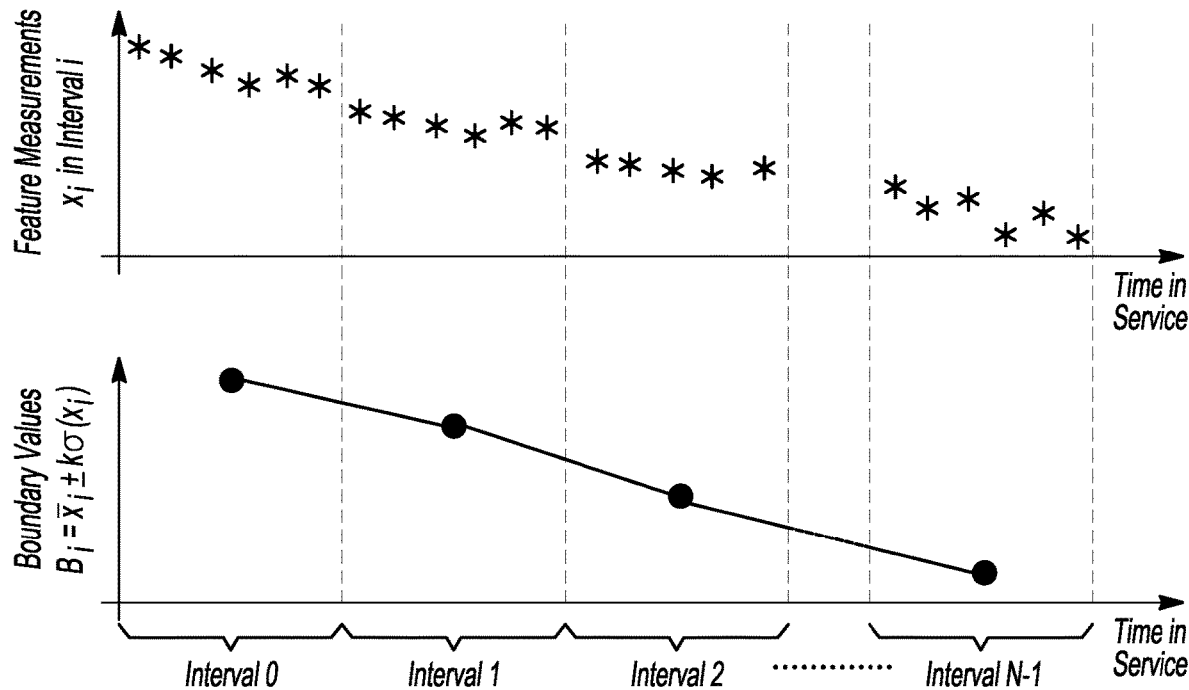
FIG. 1 is a plot defining a boundary definition for a battery feature that decreases with age.

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The strategies described here identify batteries that will fault prematurely with a high probability. In a preferred implementation, a premature battery fault is predicted with a defined confidence level. The identification takes place before the fault actually occurs. This gives the driver of the vehicle time to change vehicle operating habits or to replace the battery.

Some features that are used for the identification of a prematurely faulting battery are measurements of battery characteristics that may be made by an on-board battery monitoring system. However, they may also be made by service personnel during vehicle maintenance using measurement devices that may be found in a vehicle repair facility. Hence, the strategies are flexible and not tied to a specific onboard vehicle infrastructure.

An auxiliary battery type and size (e.g., 12V) is chosen for each vehicle in order to ensure that a high percentage of batteries that are installed achieve a targeted life expectancy. However, some batteries may not achieve the target life expectancy, because the vehicle is operated in unexpected ways, or because the batteries themselves are flawed due to deficiencies in their manufacture.

Unexpected or abnormal operation includes high key-off loads (loads on the battery that occur when the vehicle is parked) that regularly drain the battery when the vehicle is parked and infrequent or short drives. Such operation may lead to sulfation and loss of active mass in the battery. Abnormal operation may also include operation of the vehicle at high temperatures for long periods of time, which leads to evaporation of water from the electrolyte and the creation of hydrogen gas which leaves the battery without recombination with oxygen. This also will shorten the useful life of a battery and may result in the vehicle being inoperable unless the battery is replaced.

Flaws in battery manufacture include installation of electrode separators with miniscule holes, mechanically-altered electrodes that may lead to corrosion, and poor formation that leads to low battery capacity and high internal resistance. Such flaws may also result in a battery not reaching its life-expectancy design target with the associated drop in customer satisfaction.

Batteries that will fault prematurely with a high probability may be identified early, i.e., before the fault actually occurs, by analyzing a set of key measured characteristics or features and identifying the outliers. The accuracy of identification may be improved by comparing a set of key characteristics at a given age to measurements of large groups of batteries that are known to have an acceptable life expectancy and to measurements from large groups of batteries that were known to fault early.

Instead of relying on battery models with measured or adapted parameters to estimate battery performance and identify an end of life condition or the time until an end of life condition is reached, certain strategies described here treat batteries as black boxes with measurable features. It searches for abnormal data trends that do not correspond to healthy batteries or uses supervised learning to sort data describing features into bins corresponding to acceptable and non-acceptable life expectancy. Battery data that is used to define healthy or unhealthy trends resides in a data bank located in a central computing center or "cloud" that is supplied with measurements from a fleet of vehicles. The data analysis and supervised learning occurs in the central computing center as well.

The set of key features that is used to identify a battery that will fault prematurely includes normed internal resistance and capacity, as well as water loss. Measurements of the key features may be made by an on-board battery monitoring system. However, they may also be made by service personnel using measurement instruments that may be found in a vehicle maintenance or repair facility. In that case, the measured features may be normed in the vehicle before sending the corresponding data to the central data bank or cloud, or they may be normed in the cloud itself.

If it is predicted that a battery will fault prematurely, the vehicle's owner may choose to replace it. Irrespective of whether the battery is replaced, the owner (or driver) may review the operation of the vehicle in order to identify operation that would cause the battery to prematurely fault. That operation may include the activation of key-off loads for long periods of time (for example, using a DVD player or other entertainment device often while the vehicle is parked) or using the vehicle infrequently for short trips. The owner or operator may change operating habits in order to extend the life of a faulting battery or achieve a long life of a new battery.

Besides alerting the driver or owner, the strategies (cloud-based early fault prediction algorithm) may trigger the writing of a code in an on-board vehicle memory indicating a prematurely faulting battery. Maintenance personnel may suggest a replacement of the battery or a change in the operation of the vehicle if such a code is registered. The information may be used by a dealership associated with the vehicle to contact the owner and alert him of an impending fault. Information stored in a central data bank or cloud may also be used by engineering personnel to compile statistics on battery faults and as a basis for choosing a new battery type, size, or packaging location if excessive premature battery faults occur.

Certain existing concepts use mathematical models to describe battery behavior during individual charge-discharge cycles as well as over its cycle life. Some concepts that identify faulting batteries or estimate the remaining useful life of batteries use models to simulate internal electro-chemical processes in the battery.

The proposed concepts here do not use models to simulate or estimate battery behavior (e.g., the voltage response to a defined discharge current). Instead, they rely on a large set of measurements of physical characteristics of batteries that are known or assumed to be either aging at the correct pace or aging too quickly to determine whether a given battery belongs in one of those two categories. In this way, a model is replaced by a posteriori knowledge that is gathered through measurements.

Two methods are described below to identify 12V lead-acid batteries that are aging prematurely. Both rely on the concept of comparing measured features of a given battery at points in time to measured features of a large set of batteries at those points in time stored in a data base. Each of the two methods use at least normed internal resistance and battery capacity as features. Normed internal resistance is defined as the internal resistance measured at 25° C. with a fully charged battery. Values for these features may originate from an onboard battery monitoring sensor, or they may be put into the data bank manually through a graphical user interface on a smart device or computer, or through a data link from test equipment in a garage. The two methods may be expanded to include additional features as well.

Method using Large Battery Data Set to Identify Prematurely-Aging Batteries. This method compares features of a given battery at points in time to features of a large set of batteries at those points in time, and it is assumed that the batteries in the large set are mostly aging at an acceptable rate. The mean and standard deviation of the measured features in the large set define a threshold differentiating batteries that age at an acceptable rate from batteries that age prematurely.

Definition of Threshold Differentiating Prematurely-Aging Batteries. Values of normed internal resistance and capacity are collected from vehicles with lead-acid batteries of interest over one or more years (e.g., at least four seasons). The values are sorted for each combination of battery size and type. Values for each combination of size and battery type are maintained in a separate data bank. Each value is associated with a time stamp corresponding to the time in service of the battery. This defines the elapsed time since the battery is installed in the vehicle.

Measurements in defined time-in-service intervals are grouped together. The intervals may correspond to days, weeks or months and do not have to be equal in length. Measurements in each group may be analyzed by a density-based clustering algorithm or by other means in order to define statistical parameters describing the measurements.

The statistical parameters of the measurements are then used to define the boundary between correctly aging and prematurely aging batteries. For example, the mean and standard deviation may be used to define the boundary for each interval as defined in equation (1):

$$B_i = \bar{x}_I \pm k\sigma(x_i). \tag{1}$$

In equation (1), $B_i$ represents the boundary value for time interval i, $x_i$ represents the set of feature values measured during the time interval i, $\bar{x}_I$ represents the mean of the values measured during the time interval, $\sigma(x_i)$ represents the standard deviation of the set of measured values x, and k is a tuning factor. The use of addition or subtraction (±) in the equation depends on whether battery aging shifts the values of the feature greater than or less than the value when the battery is new. For example, the normed internal resistance of a battery increases with age. Hence, equation (1) would add the term with the standard deviation to the mean. On the other hand, battery capacity decreases with age. Hence, the equation would subtract the term with the standard deviation from the mean. FIG. 1 illustrates the calculation of boundary definition points from measurements over N–1 intervals. As illustrated in FIG. 1, a continuous boundary may be defined by interpolating between boundary values $B_i$ defining each interval.

Figure 2:
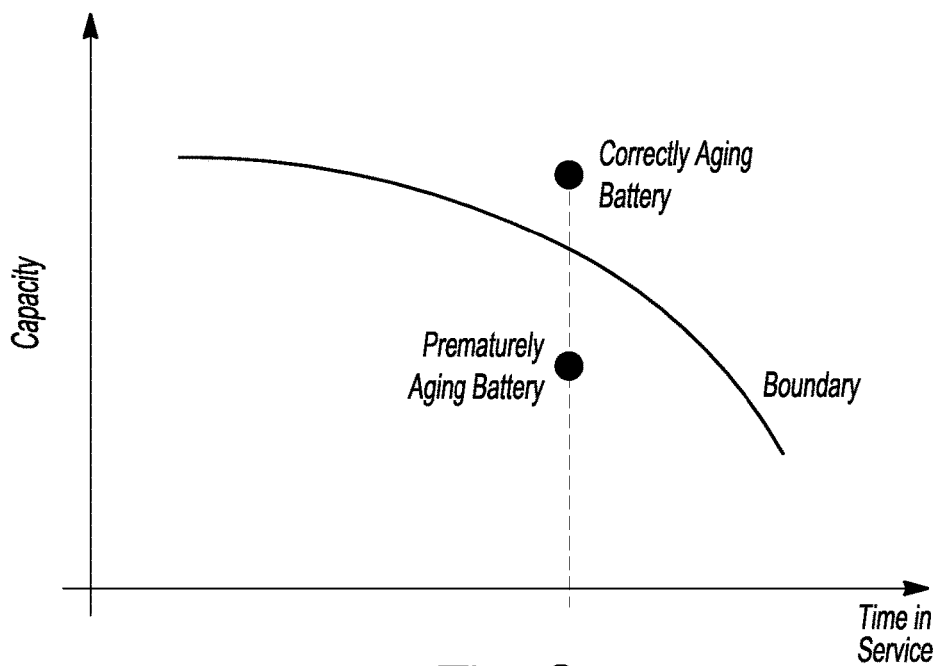
FIG. 2 is a plot of capacity versus time in service for which data points below the line correspond to correctly aging batteries and data points above the line correspond to prematurely aging batteries.

Identification of Batteries Exhibiting Premature Aging. In order to determine whether a given battery is aging prematurely, its feature values are mapped to the boundary definition described above. In the case of battery capacity, a prematurely aging battery may be identified if the capacity is below the boundary defined at the time of service of the measurement. This is illustrated in FIG. 2.

Figure 3:
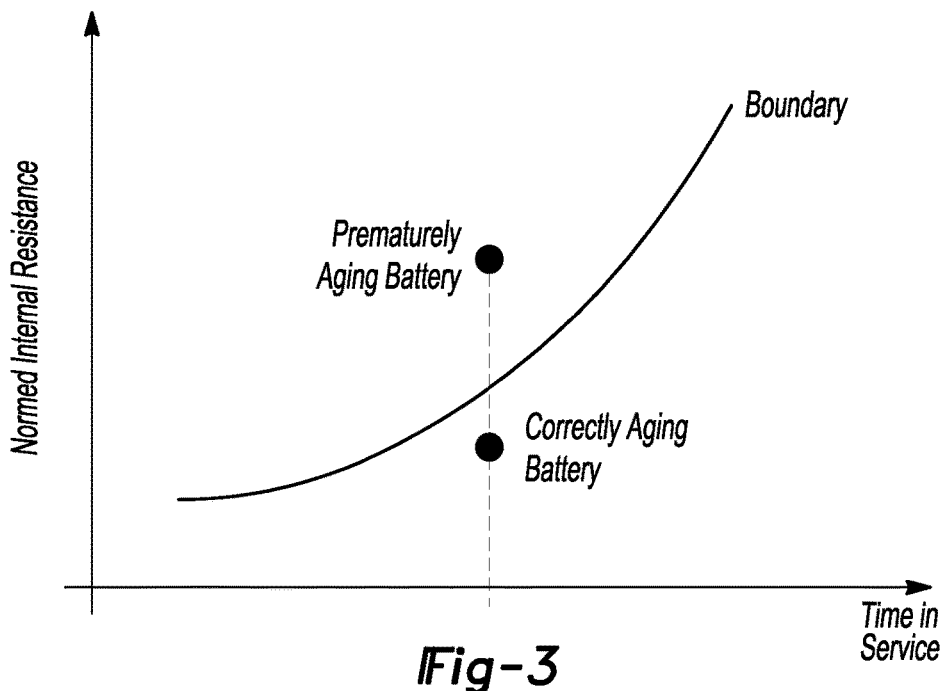
FIG. 3 is a plot of normed internal resistance versus time in service for which data points below the line correspond to correctly aging batteries and data points above the line correspond to prematurely aging batteries.

Similarly, a prematurely aging battery may be identified using an estimate of its normed internal resistance by mapping it to the corresponding boundary as illustrated in FIG. 3. As opposed to the capacity feature, a prematurely aging battery may be identified if the capacity is above the boundary defined at the time of service of the measurement.

Depending on the vehicle type in which a battery is implemented, or the particular design of the lead-acid battery used, the algorithm that makes the final battery health classification (correctly aging or prematurely aging) may classify a battery to be prematurely aging if the trend of normed internal resistance identifies premature aging, the trend of capacity identifies premature aging, or both trends of capacity and normed internal resistance identify premature aging.

Additional Battery Health Features to Identify Premature Aging. Normed internal resistance and battery capacity estimates that are measured by an onboard battery monitoring sensor have proven to be reliable features to identify batteries that age prematurely. In addition, the application of normed cranking voltage as a feature combined with normed internal resistance and capacity has been successfully investigated as well. Normed cranking voltage is calculated by some onboard battery monitoring sensors and sent to electronic control units in the vehicle. The normed cranking voltage estimates the voltage response of the battery to a defined cranking current pulse at a given state of charge and temperature.

Battery water loss may also be used as a feature. This is determined by recording the weight of the battery when it is new and weighing it periodically when the vehicle is brought into a service center for maintenance. The weight is measured by disconnecting the battery from the vehicle and putting it on a scale. This may be done by service personnel as a part of a regular service procedure. The measurement data may be given into a computer terminal or hand-held device with an interface to a cloud-based data bank.

Other features may be added as well. This may be necessary if battery designs change or if vehicle use changes in the future and causes batteries to fault with different combinations of mechanisms than is the case now.

Figure 4:
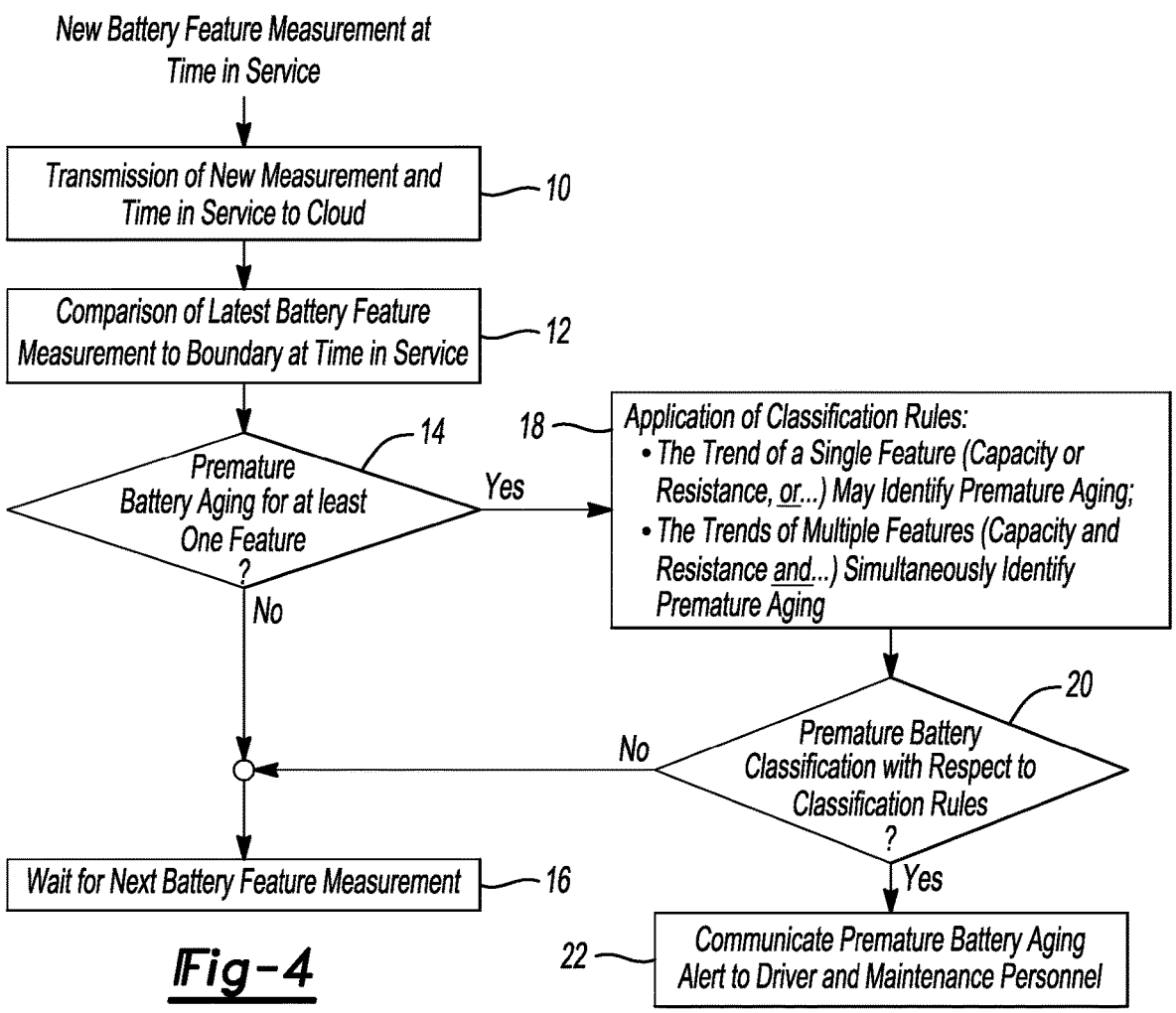
FIG. 4 is a flow chart of an algorithm for identifying premature aging using a large battery data set.

Classification Strategy to Identify Premature Aging. The classification strategy that applies the identification algorithm described above and the classification rules described above is illustrated in FIG. 4. As described, additional features besides capacity and normed internal resistance may be added to the classification strategy.

It is assumed that the classification strategy is implemented in a central computing center that may be also referred to as a "cloud." The data bank of battery measurements that is used to calculate the boundary between correctly aging and prematurely aging batteries as described above is calculated and stored in the cloud as well.

New measurements of battery features may be triggered automatically by changes in the vehicle state or periodically if the vehicle is equipped with an onboard battery monitoring sensor and a modem that can connect with the central computing center (cloud). For example, normed internal resistance and battery capacity may be sent to the cloud every time the vehicle is put into a torque-enabled mode (drive mode) or every time it is parked (key-off). The data may also be sent to the cloud periodically. For example, data may be sent every day, every week, or every month.

New measurements that are made by maintenance personnel may also be sent to the cloud. If the vehicle is not equipped with an onboard battery monitoring sensor, maintenance personnel may use commercially-available battery test equipment to make measurements of internal resistance and capacity. The test equipment may be linked to the central computing center (cloud), or measurement data may be entered into a computer terminal or hand-held device with an interface to a cloud-based data bank. As described above, the weight of the battery may also be uploaded to the central computing center in this way. All new measurements that are made automatically, or by service personnel and entered manually, may trigger the process.

At operation 10, new battery feature measurement and time in service data triggers transmission of such data to the cloud. At operation 12, the latest battery feature measurement is compared to the boundary at that time in service. At operation 14, it is determined whether at least one feature is indicative of premature battery aging. If no, the algorithm waits for the next battery feature measurement at operation 16.

If yes, at operation 18, the classification rules are applied. The trend of a single feature may identify premature aging, or the trends of multiple features simultaneously may identify premature aging. At operation 20, it is determined whether a premature battery classification with respect to the classification rules is appropriate. If no, the algorithm returns to operation 16. If yes, at operation 22, a premature battery aging alert may be communicated to the driver and/or maintenance personnel.

Method using Statistics of Healthy and Faulted Batteries from Large Battery Data Set to Identify Prematurely-Aging Batteries. This method uses the statistics of large sets of batteries that have been monitored over time and applies them to a supervised learning algorithm. The large set of batteries are monitored until they reach their end of life and then categorized as correctly aging (exceeding or meeting the target life expectancy) or prematurely aging (not reaching the target life expectancy). The algorithm categorizes a given battery that has not faulted yet as aging correctly or aging prematurely depending on the statistical similarity to the subsets of batteries that were known to be correctly or prematurely aging. This is opposed to the method described that uses the statistics of a single large set of batteries to determine whether a given battery is aging prematurely depending on its similarity to that larger single set. The improved algorithm that is used here also provides a measure of confidence level to the classification of a battery.

As in the method described above, the method described here classifies batteries using measurements of the features normed internal resistance and capacity. In addition, other features such as water loss may be added as well to improve the accuracy of the classification.

Battery Data Bank for Supervised Learning. Measurements from subsets of batteries that have been classified as aging correctly and aging prematurely are processed as follows. Values of normed internal resistance and capacity are collected from vehicles until the batteries fault. Each measured value is associated with a time stamp corresponding to the time in service of the battery. After a battery faults, its time in service is compared with the targeted life expectancy. If the time in service when the fault occurs is greater than the target, the battery is classified as having aged correctly. Otherwise it is classified as aging prematurely. The measured values are sorted for each classification (correctly aging or prematurely aging) and for each combination of battery size and type.

Measurements in defined time-in-service intervals are grouped together. The intervals may correspond to days, weeks, or months and do not have to be equal in length. Measurements in each group may be analyzed by a density-based clustering algorithm or by other means in order to define the mean, standard deviation, and probability distribution function of the measurements in a given interval. This statistical information is maintained in a cloud-based data bank for each category of battery (correctly aging or prematurely aging) for each combination of battery size and type.

Figure 5:
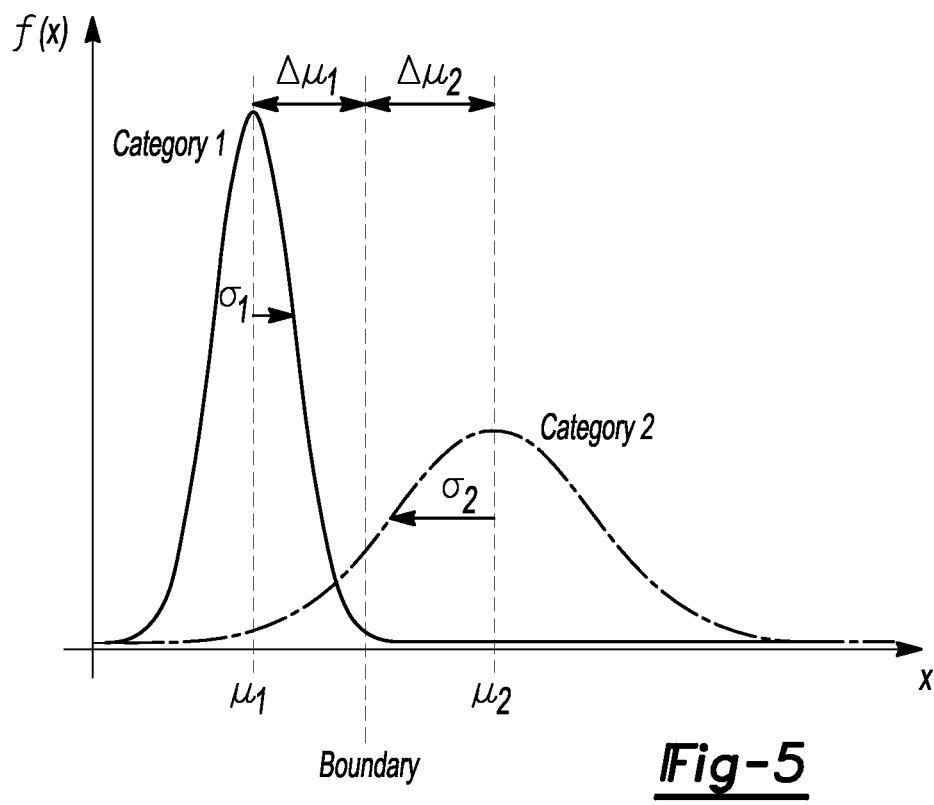
FIG. 5 is a plot of distributions and statistical parameters corresponding to two feature categories and a boundary to sort a single measurement.
Figure 6:
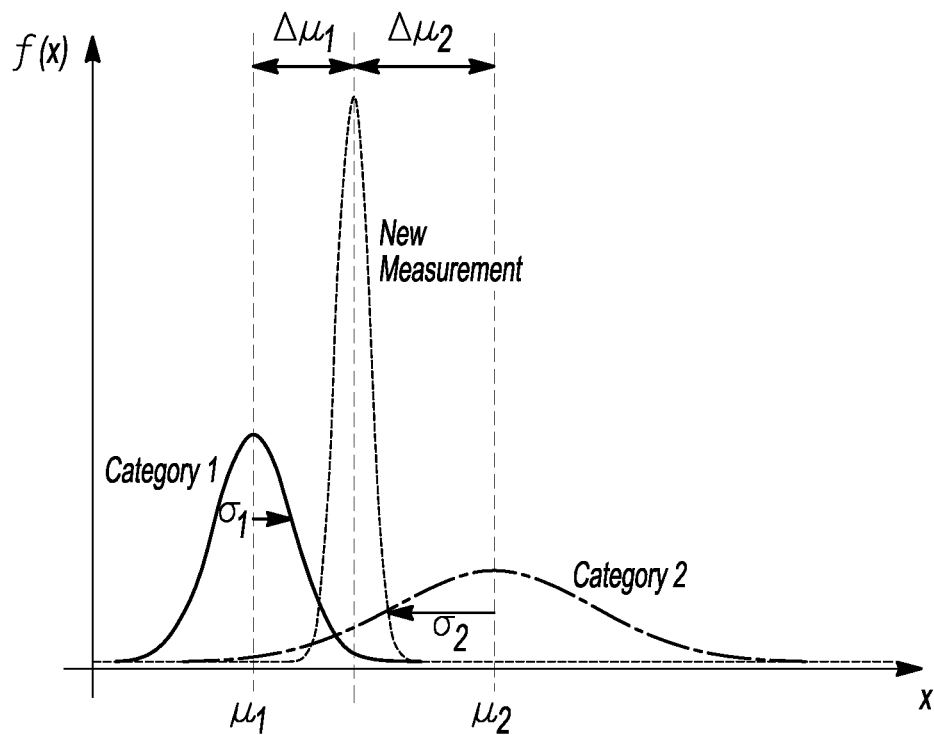
FIG. 6 is a plot of distributions and statistical parameters of a set of measurements and categorization data.

Classification Strategy to Identify Batteries Exhibiting Premature Aging. In order to determine whether a given battery is aging prematurely, its feature values (normed internal resistance and capacity) are mapped to the statistical information for correctly aging and prematurely aging batteries for that battery's size and type. The known technique of linear discriminant analysis is carried out in order to classify the battery in question as being more similar to the batteries that experienced correct aging or more similar to the batteries that experienced premature aging (the initial identification of a prematurely aging battery). Linear discriminant analysis is a supervised-learning method that compares the measurements of features that it receives with statistical parameters of the same metrics corresponding to two categories: batteries that faulted prematurely or properly. The statistical parameters of the data sets of features corresponding to each category include the mean values $\mu$, standard deviations $\sigma$ and probability density functions $f(x)$. The category that is most similar to the measured features is identified by the algorithm. FIG. 5 illustrates the distributions and statistical parameters corresponding to two categories of a feature and the boundary that may be used to sort a single measurement into one category or another. The boundary is defined by the value of the feature x that fulfills the following inequality:

$$\pi_1(x)f(x|D_1) = \pi_2(x)f(x|D_2), \quad (2)$$

where $\pi_i(x)$ is the prior probability function defining the probability that the measured value x is in the category i∈ 1,2 and $f(x|D_3)$ is the value of the probability density function value of the category i. The training data defining the two categories is defined by $D_1$ and $D_2$. The characteristics of the data that define a categorization (batteries that faulted prematurely or properly) changes over time. In order to maintain accuracy in the similarity assessment, the data that is used for categorization depends on the time in service of the battery. Instead of one set of categorization data (or parameters such as mean values, standard deviations, and probability density functions), multiple sets corresponding to defined time-in-service intervals are available and used. The intervals may correspond to days, weeks, or months, and may not have equal length. The measurement data that is stored for each category may be stored in a central computing system (cloud). Linear discriminant analysis is applied to all the data that is measured during an interval as it is made available. This means that a growing set of measured data is compared with stored sets of data corresponding to category 1 and category 2, i.e., batteries that faulted prematurely or properly. The distributions of the set of measurements and the categorization data is illustrated in FIG. 6. When a set of data X that was measured in an interval is processed, linear discriminant analysis chooses the category i* that maximizes a posterior probability function:

$$i^* = \max_{i} \pi_i(X)f(X|D_i), \quad (3)$$

The linear discriminant analysis process also may be used to calculate the confidence level of the classifications that it makes. The confidence level is the probability that the correct category is chosen given the set of measured data. That probability may be calculated by the equation $$p_i(X) = \frac{\exp(s_i(X))}{\sum_{j=1}^{R} \exp(s_j(X))}, \quad (4)$$

where $s_i(X)$ is a function that is dependent on the means and the covariances of the training data that corresponds to each category as well as the prior probability function $\pi_i(X)$.

Figure 7:
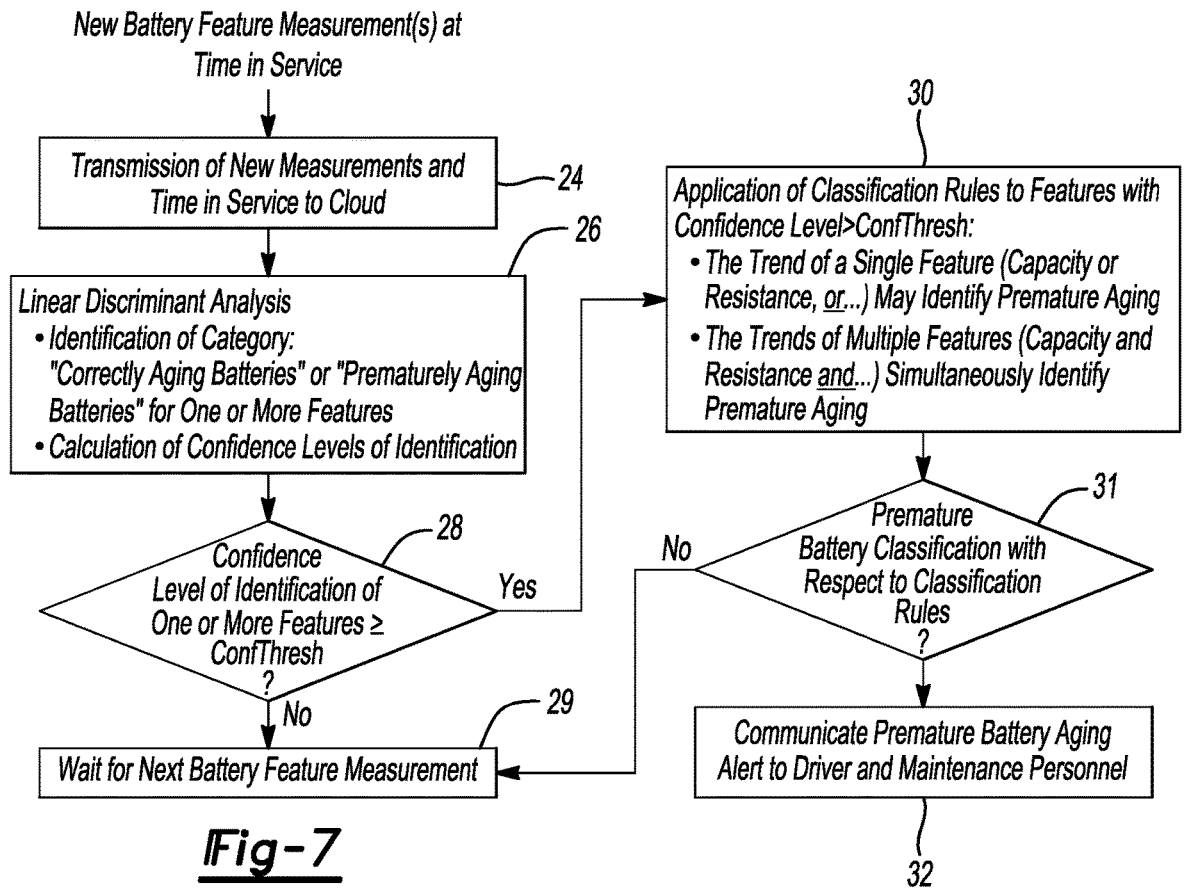
FIG. 7 is a flow chart of an algorithm for identifying premature aging in batteries with supervised learning using large battery data sets of correctly and prematurely-aging batteries.

A high level of certainty or confidence is required when a battery is classified as prematurely aging if the classification effects warranty. For this reason, the classification strategy may be implemented in such a way that communication of a prematurely aging battery to the driver or maintenance personnel only takes place if a battery is identified in this way with a confidence level that is above a predefined threshold. The classification strategy is illustrated in FIG. 7. The predefined threshold for the confidence level is designated ConfThresh. Classification rules as described above may be applied if more than one feature, e.g., internal resistance and capacity, are used. Depending on the vehicle type in which a battery is implemented, or the particular design of the (lead-acid) battery used, the algorithm that makes the final battery health classification (correctly aging or prematurely aging) may classify a battery to be prematurely aging if the normed internal resistance identifies premature aging, the capacity identifies premature aging, or both the capacity and normed internal resistance identify premature aging.

At operation 24, new battery feature measurement and time in service data triggers transmission of such data to the cloud. At operation 26, linear discriminant analysis is performed, which involves identification of category, correctly aging or prematurely aging, for one or more features, and calculation of the confidence levels of identification. At operation 28, it is determined whether the confidence level of identification of the one or more features is greater than or equal to ConfThresh. If no, the algorithm waits for the next battery feature measurement at operation 29. If yes, at operation 32, classification rules are applied to the one or more features with the confidence level greater than or equal to ConfThresh: The trend of a single feature may identify parameters of aging or the trends of multiple features simultaneously may identify premature aging. At operation 31, it is determined whether a premature aging classification results from operation 30. If no, the algorithm returns to operation 29. If yes, at operation 32 a premature battery aging alert may be communicated to the driver and/or maintenance personnel.

As in the case of the strategy described above, more battery features than normed internal resistance and battery capacity may be used to identify prematurely-aging batteries. Using more features may result in improving the confidence level of similarity identification for new battery types or new battery implementation designs (packaging space, battery size and chemistry), because they provide more planes in the data space to separate data clusters belonging to the battery classifications. For example, water loss may be added as an additional feature. It may be measured by periodically weighing the battery.

As described, new measurements of battery features may be triggered automatically by changes in the vehicle state or periodically if the vehicle is equipped with an onboard battery monitoring sensor and a modem that can connect with the central computing center (cloud), or data may be automatically sent to the cloud periodically. New measurements that are made by maintenance personnel may also be sent to the cloud. If the vehicle is not equipped with an onboard battery monitoring sensor, maintenance personnel may use commercially-available battery test equipment to make measurements of internal resistance and capacity. The test equipment may be linked to the central computing system (cloud), or measurement data may be given into a computer terminal or hand-held device with an interface to a cloud-based data bank.

Communication Strategy. Information that a battery is aging prematurely may cause the driver to replace the battery. The driver may also use the information to change his driving and vehicle use habits. This may result in the driver operating the vehicle more frequently or disconnecting loads that drain the battery while the vehicle is parked. The information may also be used by service personnel to diagnose starting problems and to recommend battery replacement. Vehicle engineering personnel may use statistics describing battery features to identify problems with the choice of a battery type and size as well as its packaging. The flow of information to the driver, to maintenance personnel, and to vehicle engineering is described in the following subsections.

Message to Driver. The driver may receive a message that the battery is aging prematurely on a multi-functional display in the vehicle or via an application on a smart device (phone, tablet, etc.). The message may also be communicated with an automated email that is sent by the central computing system (cloud).

If the message is sent to a multi-functional display or via an application on a smart device, it may be linked to suggestions describing mitigations. They may include driving the vehicle more frequently, deactivating devices or loads that are active and drain the battery while the vehicle is parked, and replacing the battery.

Message to Service Personnel. Service personnel may be made aware of a prematurely-aging battery through a code. In this case, the central computing system (cloud) sends a message to the vehicle that a prematurely-aging battery has been identified, and the message triggers the setting of a code. If a vehicle is registered to a specific service center, the central computing system may send a message to the service center with a coded message or email. The service center may then contact the vehicle owner with the information and suggest a mitigation. The information may also be used to diagnosis vehicle problems associated with the battery.

Information to Vehicle Engineering. Vehicle engineering personnel may use statistics describing battery features to identify problems with the choice of a battery type and size as well as its packaging. The statistics may be derived from the measurement data banks that are used to implement the strategies to identify premature battery aging. If battery data is used for this purpose, it should be regularly updated to capture changes in vehicle designs.

Infrastructure to Implement Alert for Premature Battery Aging. Central Computing System. In order to implement a for premature battery aging, a central computing system (cloud) with data banks containing battery measurement data, the ability to run the algorithms that identify premature aging, and an interface with the vehicle is required. Other interfaces to vehicle engineering and service personnel as well as to measuring equipment found in service centers may be included as well.

Figure 8:
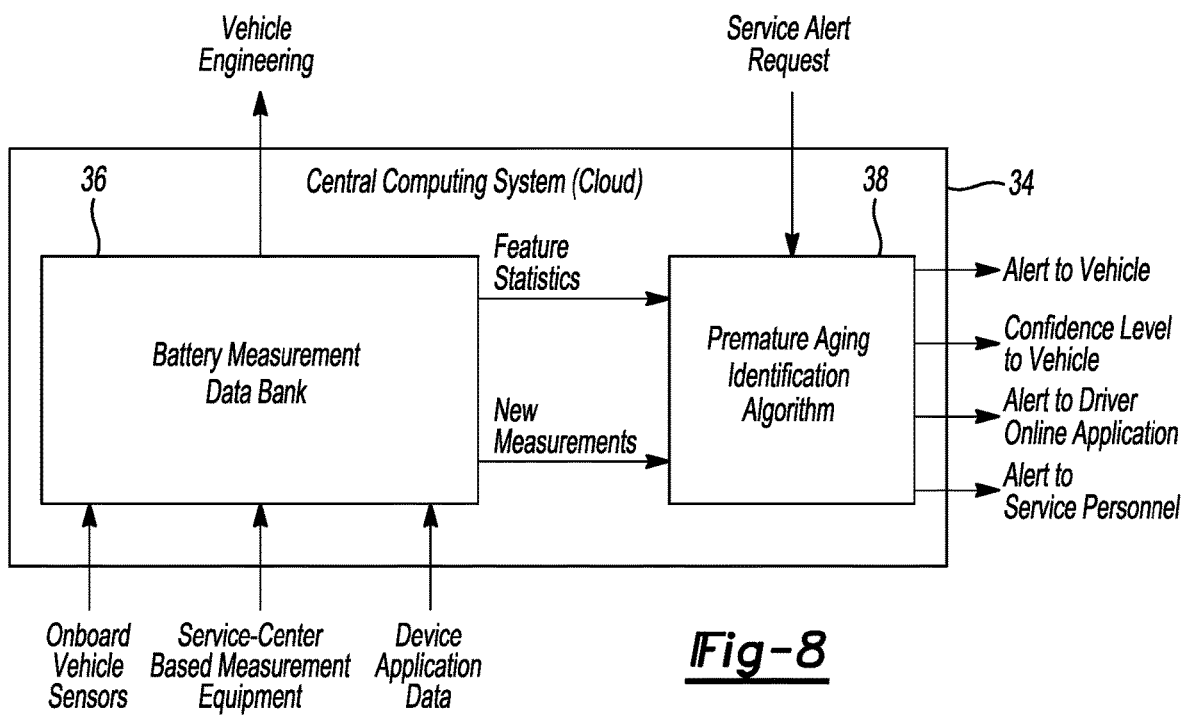
FIG. 8 is a schematic diagram of a central computing system for alerting of premature battery aging.

A central computing system 34 for premature battery aging alert is illustrated in FIG. 8. The system 34 includes a battery measurement data bank 36 and a premature aging identification algorithm 38, such as those described above.

The interface between onboard vehicle sensors or service-center based measurement equipment and the central computing system 34 may be established through telematics, or information may be transferred when the vehicle is connected to a wired diagnostic interface. In that case, several sets of consecutive measurements that are stored in a buffer in the vehicle may be transferred at once.

If some or all battery data is measured in a service center by equipment that does not have an interface to the central computing system 34, the measurements may be manually entered into an application running on a smart device (cell phone or tablet) that communicates with the central computing system 34 over the Internet. The data that is transferred is referred to as "Device Application Data."

If premature aging is identified via the premature aging identification algorithm 38, a message may be sent to the vehicle using a telematic service, or it may be transferred to the vehicle when it is plugged into a wired diagnostic interface at a dealer or service center. In addition, an alert may be also sent via the Internet to an application on a smart device belong to the vehicle owner or driver. Likewise, the confidence level may be provided to the vehicle, driver, or service personnel in similar fashion.

Service personnel may request an analysis of the most current battery data using the "Service Alert Request" interface. That interface may be implemented with the Internet and represents the connection between a diagnostic tool that belongs to service personnel and the central computing system 34.

The battery measurement data bank 36 receives measurements from any vehicle that has a telematic or wired diagnostic interface. It uses measurements from many such vehicles to create the statistics and calculate the statistical norms necessary to carry out the algorithms described herein (e.g., probability distribution functions, means and standard deviations of features for each battery size and type, etc.). Vehicle engineering services may monitor the data in order to identify battery choices or vehicle designs that require improvement.

Indication of aging and confidence level may be used to implement various mitigation actions including limitation of accessory activation time after a vehicle-off transition, deactivation of stop-start functionality, and automatic high-voltage to low-voltage transfer during parking.

Limitation of Accessory Activation Time. After a vehicle experiences a key-off transition, accessories like the radio are allowed to run for a calibrated amount of time. If a prematurely faulting battery is identified, the maximum allowed run time after key-off may be decremented or set to zero.

Deactivation of Stop-Start Functionality. Aging of a battery is accelerated by frequent discharges and operation at a low state of charge. Deactivating the stop-start functionality will eliminate discharges when a vehicle is stopped by allowing it to idle. In doing so, the average state of charge of the battery will increase.

Automatic or Frequent High-Voltage to Low-Voltage Transfer. Electric vehicles and plug-in hybrid electric vehicles are being designed with the capability of supporting low-voltage (12V) loads when the vehicle is parked. This capability decreases the electric driving range of the vehicle and strains some electrical components. Therefore, its use should be limited. If the battery is new, a transfer may only be initiated if the state of charge of the low-voltage battery is very low. However, if a prematurely-faulting battery is identified, transfer of power may be always initiated while a vehicle is parked.

Because the limitation of the accessory activation time probably will not be very noticeable to the driver, it may be initiated with a low confidence level. On the other hand, a customer may be sensitive to changes in electric driving range due to high-voltage to low-voltage transfer. Therefore, the confidence level threshold to initiate regular transfers may be chosen to be very high. That is, the confidence level associated with triggering a certain mitigation strategy may be different depending on the mitigation strategy. Put a different way, a value of the predefined threshold depends on the mitigating action.

Vehicle Control Using Identification of Abnormal Battery Feature Characteristics. A battery is classified as prematurely aging depending on the characteristics of several features. Here, three such features have been discussed: internal resistance, capacity, and water loss. Depending on the identification rules described herein, one or more features are correlated with those of prematurely aging batteries in order to classify a battery as prematurely aging. One feature alone may not be sufficient for a classification.

If the characteristics of a single feature has a correlation to batteries that are prematurely aging however, mitigating controls may be initiated without classifying a battery as prematurely aging and issuing an alert to the driver or service personnel. As an example, battery water loss may be monitored as described. If the value of the water loss metric is identified as being more similar to the water loss characteristic of batteries with premature life expectancy, although the battery otherwise cannot be classified as prematurely aging, a mitigating strategy may decrease the charge voltage setpoint by an incremental calibrated value. This would have the effect of decreasing water loss over time.

Here too, the activation of the mitigation action may be dependent on the identification of abnormal water loss, i.e., the value of the water loss metric is identified as being more similar to the water loss characteristic of batteries with premature life expectancy, with a confidence level that is greater than a defined threshold. Using the confidence level of the identification as a part of the conditions to activate the mitigation strategy limits the use of the strategy. In the case of decreasing charge voltage, this is desirable as doing so may have negative effects on battery life as well.

Battery Measurement Data Bank. Two types of methods were introduced to identify prematurely aging batteries. First, a method and corresponding algorithm were introduced that use a single large set of battery data to identify premature aging. The algorithm identified batteries exhibiting data outliers as aging prematurely. Second, a method and corresponding algorithm were described that use two large sets of data of batteries that were known to age correctly and fault prematurely. It takes a supervised-learning approach to determine whether a given battery has more similarities to the sets of batteries that aged correctly or prematurely. The battery data banks that are used to implement each method are different. While the first method uses a single data bank with uncategorized batteries, the second uses two data banks corresponding to two categories of batteries: correctly aging and prematurely aging. The two types of battery data banks for the two identification methods are described in the following two subsections.

Battery Measurement Data Bank for Single Unsupervised Data Collection. A schematic diagram of the battery measurement data bank 36 that is implemented with the identification algorithm 38 using a single large data set is illustrated in further detail in FIG. 9.

Figure 9:
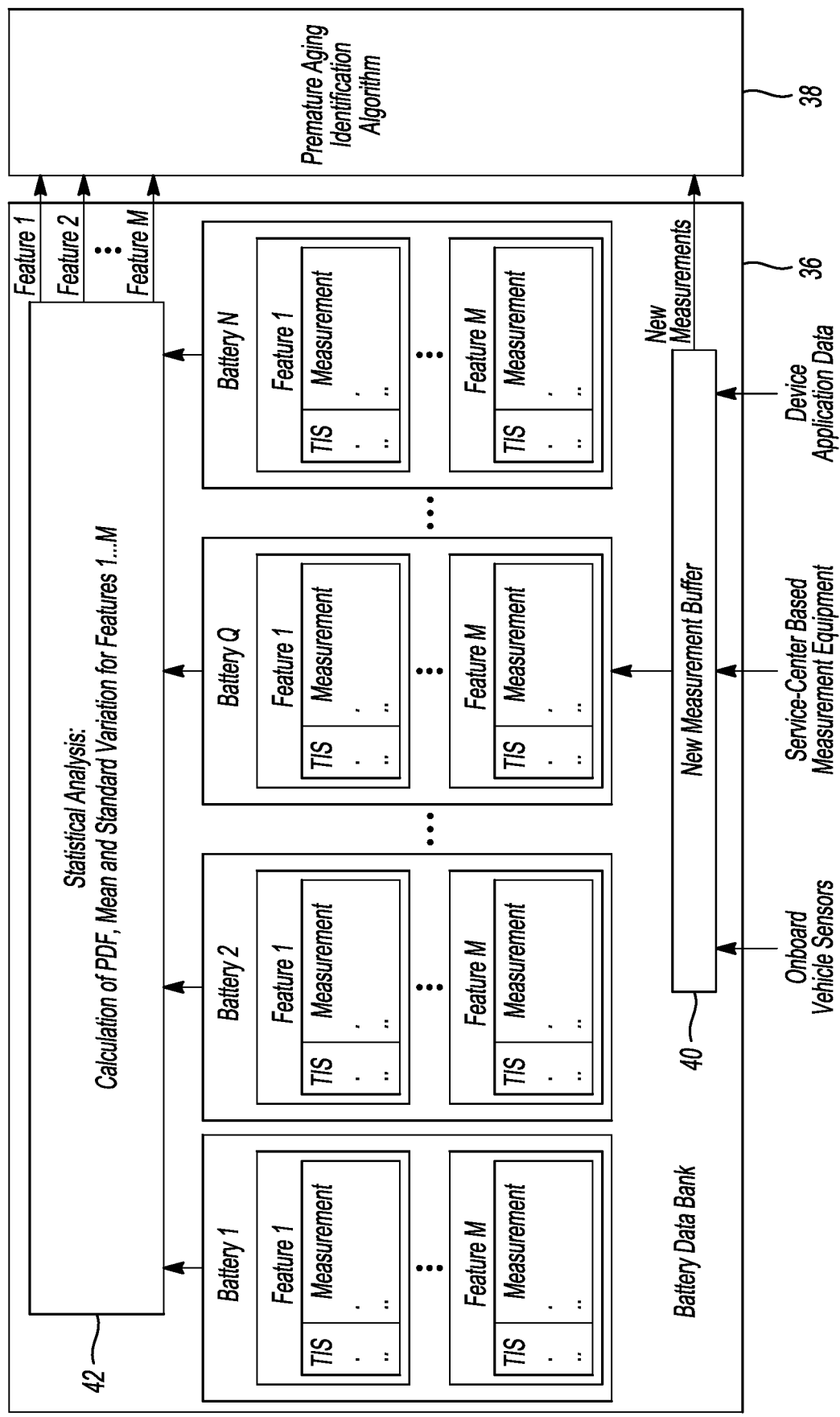
FIG. 9 is a schematic diagram of the battery measurement data bank and identification algorithm of FIG. 8 for a single battery type-size combination.

FIG. 9 is a generic diagram showing that data for N batteries is maintained in the data bank 36, and measurements of M features for each of the N batteries are saved there. Each measurement is associated with a "Time in Service" (TIS). This is the amount of time that has elapsed since the battery was installed. Commercially available battery monitoring sensors keep track of the time in service and provide this information in a signal that may be read by an electronic control unit.

One such data bank is necessary for each type (flooded, advanced flooded, AGM, . . . ) and size combination of battery. The data bank 36 includes a new measurement buffer 40 where the latest measurement of each feature is stored. This may be necessary because measurements of all features may not occur at the same time. For example, normed internal resistance and capacity may be measured by an onboard sensor and transmitted to the computing center each time a vehicle begins a trip, but the battery weight, which is used to calculate water loss, may be measured only when the vehicle is brought into a service center for regular maintenance.

The battery measurements that are stored in the data bank 36 are processed via statistical analysis module 42 to calculate statistical information for each feature. This includes the probability density function (PDF), mean, and standard deviation. That information is provided to the premature aging identification algorithm 38, which uses it to calculate the threshold as described above. The newest measurements from the new measurement buffer are also supplied to the algorithm. As described above and illustrated in FIG. 4, the algorithm to identify prematurely-aging batteries is triggered whenever a new measurement occurs.

Measurements from the battery that are being monitored by the algorithm 38 are added to the data bank 36 during the life of the battery. The battery that is being monitored is designated "Battery Q" in FIG. 9. Each new measurement and its corresponding time in service that enters the new measurement buffer are added to the data corresponding to "Battery Q." The battery data corresponding to other vehicles may be updated as well. For this reason, the statistical analysis module 42 calculating the probability distribution function, mean, and standard deviation should be periodically updated.

Battery Measurement Data Bank for Supervised Data Collection. A schematic diagram of battery measurement data banks 44, 46, and the identification algorithm using supervised learning 48 that was described above is illustrated in FIG. 10. The data banks 44, 46 and the identification algorithm 48 are implemented in a central computing system (cloud) similar to that shown in FIG. 8.

Data for N batteries is maintained in the data bank 44 for correctly-aging batteries, and data for K batteries is maintained in the data bank 46 for prematurely-aging batteries. Measurements of M features for each of the N+K batteries are saved in the two data banks 44, 46. Each measurement is associated with a "Time in Service" (TIS), which is the amount of time that has elapsed since the battery was installed. One such set of data banks for correctly and prematurely aging batteries is necessary for each type (flooded, advanced flooded, AGM, . . . ) and size combination of battery.

The battery measurements that are stored in the data banks 44, 46 are processed via respective statistical analysis modules 50, 52 to calculate statistical information for each feature. This includes the probability density function (PDF), mean, and standard deviation of the measurements for each feature. That information is provided to the premature aging identification algorithm 48 which uses it to categorize a monitored battery as described above. The newest measurements from new measurement buffer 54 are periodically supplied to the algorithm 48. The algorithm 48 is triggered whenever a new measurement is sent to the central computing system (cloud) and enters the new measurement buffer 54.

The computing system includes the new measurement buffer 54 where the latest measurement of each feature is stored. This may be necessary because measurements of all features may not occur at the same time. For example, normed internal resistance and capacity may be measured by an onboard sensor and transmitted to the computing sensor each time a vehicle begins a trip, but the battery weight, which is used to calculate water loss, may be measured only when the vehicle is brought into a service center for regular maintenance.

Figure 10:
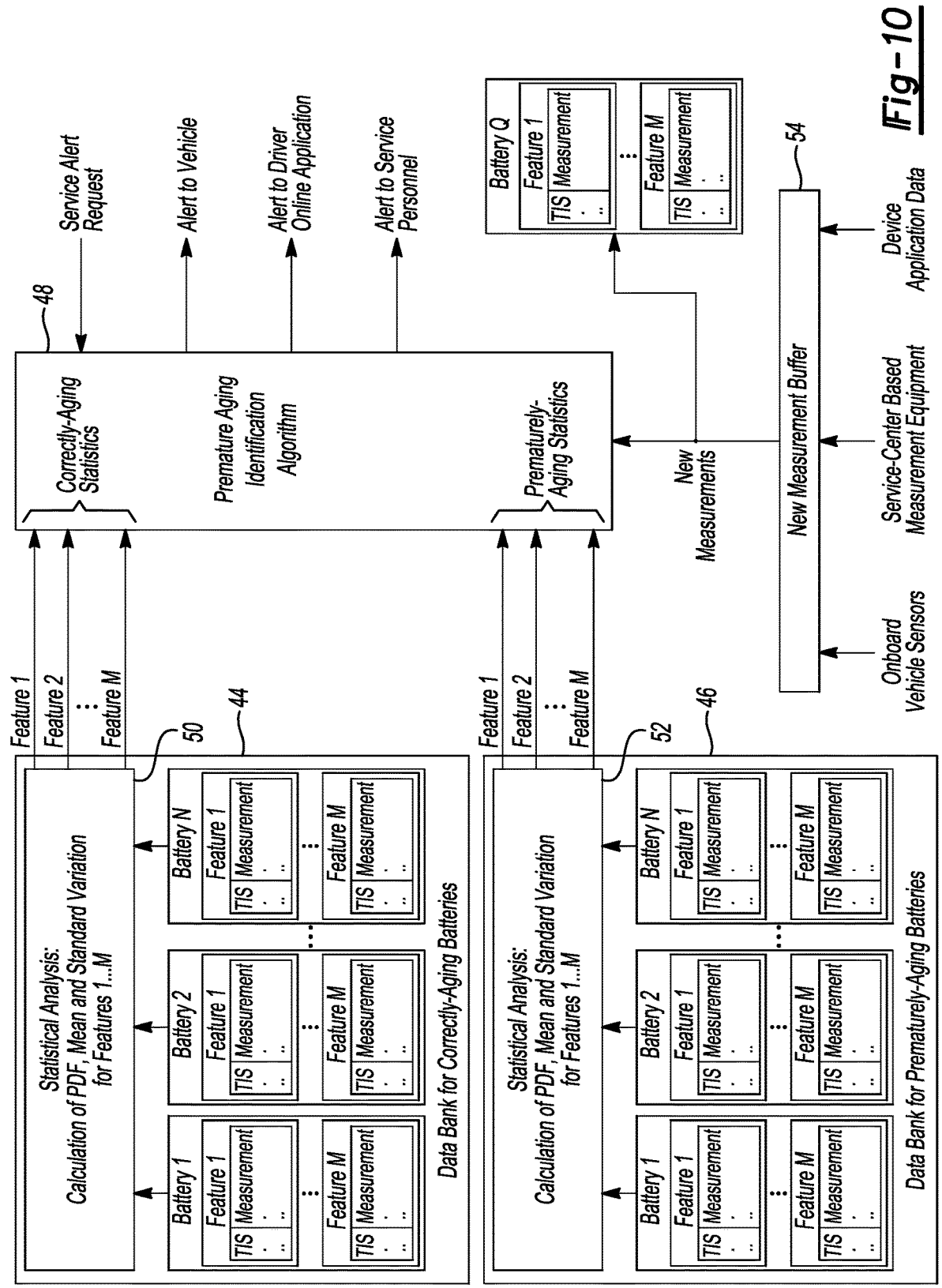
FIG. 10 is a schematic diagram of battery data banks and identification algorithm for supervised learning.
Figure 11:
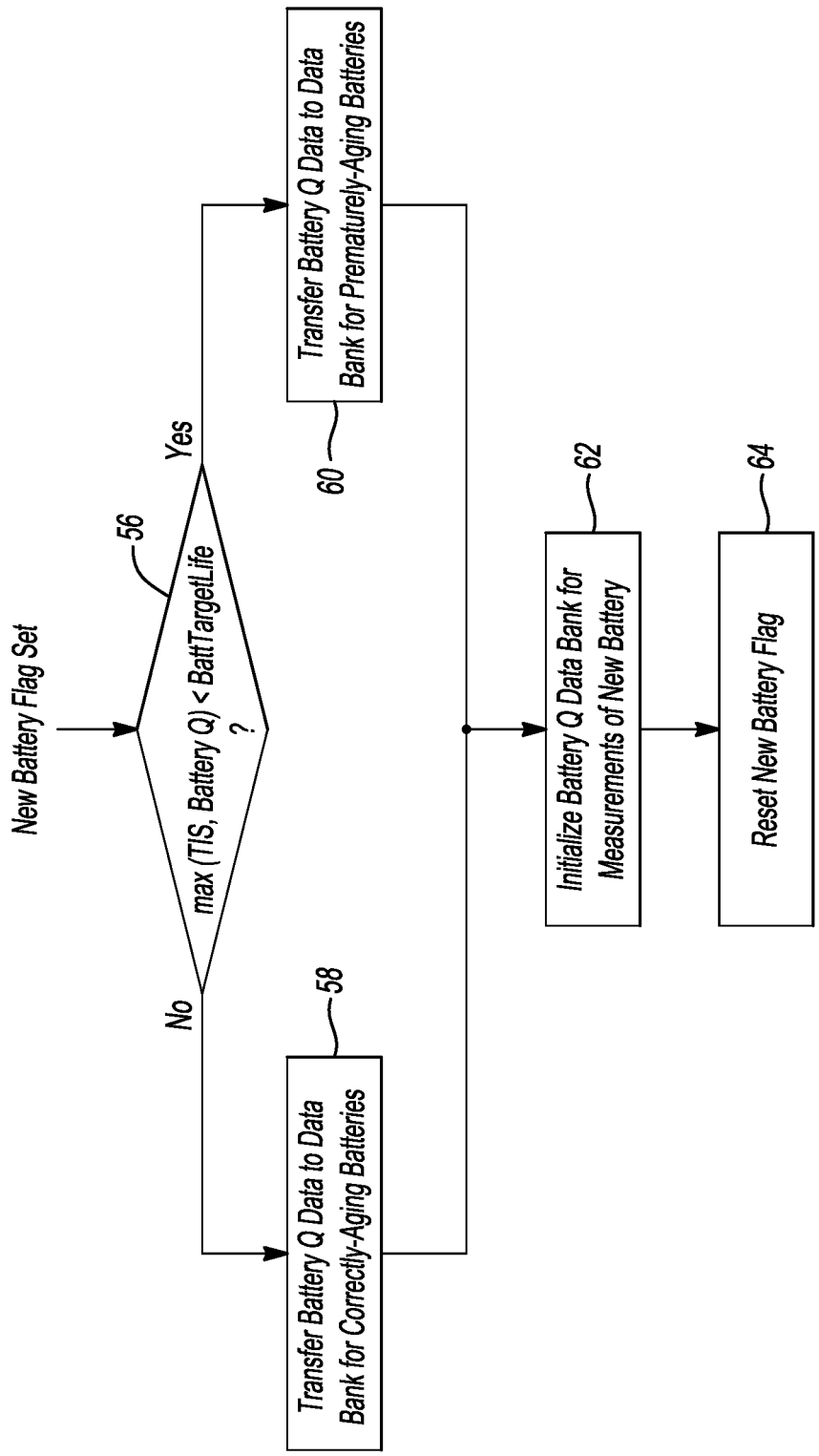
FIG. 11 is a flow chart of a battery data bank management algorithm to implement supervised learning.

Every new measurement of the battery being monitored and its corresponding time in service (TIS) is stored in a data bank designated "Battery Q" in FIG. 10. The measurements of the battery being monitored cannot be added to the data banks 44, 46 that are used for supervised learning until the battery comes to its end of life and is replaced. When this occurs, the highest recorded time in service (TIS) of the battery that is stored in the data bank for "Battery Q" is compared with the target life expectancy BattTargetLife. If the time in service of the battery when it is replaced is less than the target, it is classified as a belonging to the group of prematurely aging batteries. In that case, the measurements collected in the "Battery Q" data bank are added to the measurements for the K batteries in the data bank 46 for prematurely-aged batteries. Otherwise, the measurements are added to the data bank 44 for correctly-aged batteries. This classification of batteries depending on their age when they are replaced is a supervised-learning process. FIG. 11 illustrates this supervised-learning process to update the data banks that are ultimately used to monitor aging of a battery in a vehicle.

It is usual for a service technician to reset the battery monitoring sensor in a vehicle if a battery is replaced. It is assumed that when this occurs, a flag indicating that the battery has been replaced may be set, and this may be communicated to the central computing system (cloud) where the battery data banks and their management strategy are implemented. Even if a vehicle has no onboard battery monitoring sensor, it is assumed that service personnel may send a signal to the central computing center that the battery has been replaced by some means. It is also possible, that an onboard battery monitoring sensor has the ability to determine that a battery has been replaced and sends a signal to this effect to the central computing center autonomously. The process of managing battery data illustrated in FIG. 11 is triggered when a "New Battery Flag" is set.

Once it is determined that the battery has been replaced, the process at operation 56 compares the maximum time in service (TIS) that is stored in the data bank for "Battery Q" with the target battery life BattTargetLife. If the maximum time in service exceeds the target battery life, the measurements of the replaced battery are transferred to the data bank for correctly-aging batteries at operation 58. Otherwise, the data is transferred to the data bank for prematurely-aging batteries at operation 60.

After the transfer of data occurs, the data bank for "Battery Q" is initialized at operation 62 to prepare it to store measurements from the newly-installed battery. The "New Battery Flag" is then reset at operation 64 in order to prepare the process for the next battery replacement.

Figure 12:
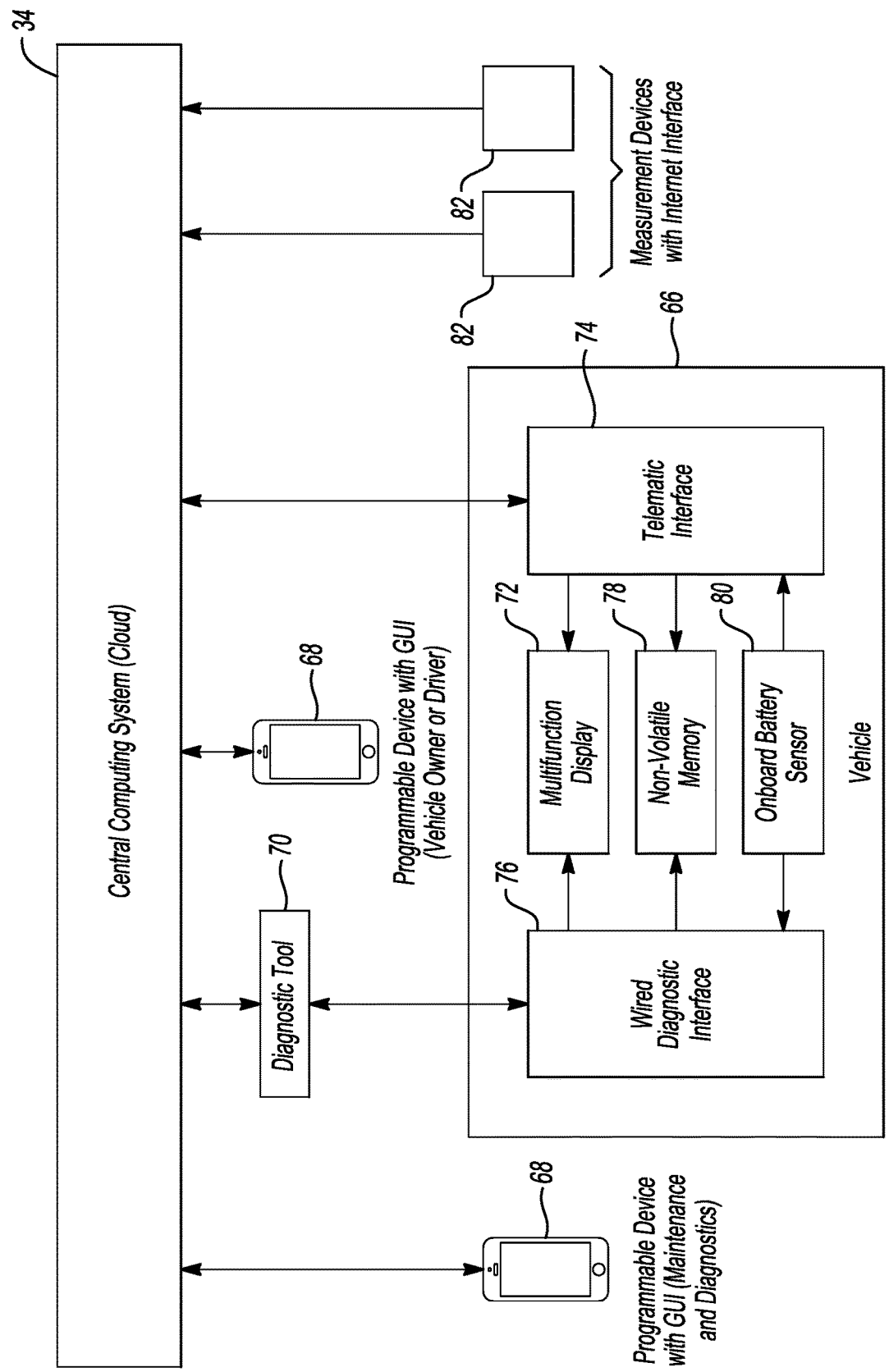
FIG. 12 is a schematic diagram of an architecture associated with premature battery aging identification.

Implementation Architecture. FIG. 12 illustrates the topology of elements that may be implemented for premature battery aging prediction including interfaces between them. The algorithm that identifies premature aging and the battery data banks that are necessary for this purpose are implemented in the central computing system (cloud) 34. Information may flow between vehicle 66 and the central computing system 34 by means of a telematic system 68 (wireless telephone-based data communication) or through a diagnostic tool 70 with a wired connection.

The driver or vehicle owner may be alerted to premature battery aging via a multifunction display 72 in the vehicle 66 or an application running on the mobile phone, tablet or other programmable device 68 with a graphic user interface. Such programmable devices are connected to the central computing system 34 via the Internet. The connection may be wireless or wired. The multifunctional display 72 in the vehicle 66 may be connected to the central computing system 34 (cloud) through a telematic interface 74 or through a wired diagnostic connection 76 to the diagnostic tool 70. The tool 70 is connected to the central computing system 34 via the Internet.

An alert of a prematurely aging battery may also be stored in the form of a code in non-volatile memory 78. The memory 78 is located in the vehicle 66, and transmission of the code may be done through the telematic interface 74 or through the wired diagnostic interface 76.

An onboard battery sensor 80 may be used to measure the battery features that are used to identify premature aging. If this is the case, the measurements and corresponding battery time in service may be sent to the central computing system 34 via the telematic interface 74 or the wired diagnostic interface 76.

Measurements of battery features or characteristics may also be made by measurement devices or test equipment 82 found in a service center. They may be battery test equipment that measure or estimate the internal resistance of the battery, its capacity, or the density of the electrolyte. They may also be generic measurement equipment such as scales to weigh a battery and estimate water loss. The measurement or test equipment 82 may have an Internet connection that may be used to transmit data to the central computing system 34 (cloud). If not, the measurements may be entered into the graphic user interface (GUI) of a programmable device like a computer tablet by service personnel. The data may then be transferred to the central computing system 34 via the Internet. Such a programmable device may also be used by service personnel to request an analysis of battery aging or to receive alerts of premature battery aging from the central computing system.

As described above, the alert provided may be used by vehicle owners, drivers, and service personnel to mitigate premature battery faults. The alerts that are provided to the driver, owner, or service personnel on programmable devices, on multifunctional displays, or through codes may result in the battery being replaced before it faults, and it may cause the driver or owner to change the operation or use of the vehicle. Changes may include driving the vehicle more frequently or minimizing the activation of electrical systems or loads while the vehicle is parked. Mitigating actions may be initiated by the owner or driver when messages are received. They may be suggested by service personnel, or suggestions may be provided through the multifunctional display or a connected device to the driver or owner along with the premature aging alert.

Finally, the vehicle manufacturer may have access to the battery data banks that are stored in the central computing system as well as the premature battery aging alerts that are issued. This information may be used to improve the design of vehicle power supplies. The information may be particularly useful for choosing battery sizes and types on a given vehicle to improve the life expectancy of the low-voltage (12V) battery and to minimize its associated warranty.

Several methods to identify premature aging of batteries used in vehicles and an infrastructure to carry out the identification have been described. The infrastructure includes data collection, data storage and processing, identification algorithms, and messaging or alert interfaces.

The methods collect measurements of battery features or characteristics and identify premature aging based on how the features change over time and based on the similarity of the measurements to those of batteries that were known to age prematurely. The measured features are chosen for their known correlation to battery health and aging. However, the measurements are not used to model the electrical behavior of the battery.

The features or characteristics of other battery chemistries and types may be monitored as well in the same way in order to identify premature aging. For example, internal resistance, capacity, and other features may be used to identify premature aging in lithium-ion batteries. Hence, the basic methods and infrastructure described here may be applied to other battery types used in vehicles. This includes batteries used in medium voltage systems (48V) or high-voltage traction batteries as well.

Furthermore, the scope may be expanded to include batteries implemented in aircraft, ships, and stationary power supplies (for example domestic power supplies) that use lead-acid and other battery chemistries batteries for energy storage. Domestic stationary power supplies that are supplied by solar cells and wind turbines often use large banks of lead-acid batteries and other battery types for energy storage, and premature faults of individual batteries is a problem with potential economic implications that may be addressed.

Methods to identify prematurely-aging batteries using a large battery data set are described above. A measure of the certainty of the identification of a measurement $\gamma$ may be estimated to be proportional to the distance between the boundary between categories at the measurement point B(x), as illustrated in FIG. 1, and the value of the measurement point x:

$$\gamma = k|B(x)-x|, \quad (5)$$

where k is a tuning factor. Other methods may be employed to calculate the confidence level, defined as the probability that the identification of a category is correct given the measured data and training data defining the categories. In addition, other methods may be employed to identify the category and to calculate a measure of the certainty of the identification or the confidence level of the identification.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A control system comprising:
one or more processors programmed to,
responsive to receiving values of one or more parameters of a battery of a vehicle for a particular time in service, generate via a machine learning determination a level of confidence at which the values of the one or more parameters of the battery match values of one or more parameters of a set of batteries for a same time in service, and
responsive to the level exceeding a predefined threshold, cause a mitigation action to be implemented, wherein a value of the predefined threshold depends on the mitigation action.

2. The control system of claim 1, wherein the mitigation action is deactivation of stop-start functionality or a reduction in on-time for accessory loads while the vehicle is parked.

3. The control system of claim 1, wherein the one or more processors are further programmed to, responsive to the level exceeding the predefined threshold, output an alert indicative of an aging battery.

4. The control system of claim 3, wherein the one or more processors are further programmed to, responsive to the level not exceeding the predefined threshold, preclude output of the alert.

5. The control system of claim 1, wherein the battery is a vehicle battery.

6. The battery management system of claim 1, wherein the one or more processors are in a vehicle.

7. A battery management system comprising:
one or more processors programmed to
output an alert for a vehicle responsive to a machine learning determination that values of one or more parameters of a battery of the vehicle for a particular time in service match values of one or more parameters of a set of batteries for a same time in service with a level of confidence that exceeds a predefined threshold, and
preclude output of the alert responsive to a machine learning determination that the values of the one or more parameters of the battery match the values of the one or more parameters of the set with a level of confidence that does not exceed the predefined threshold.

8. The battery management system of claim 7, wherein the one or more processors are further programmed to cause a mitigation action to be implemented responsive to the level exceeding the predefined threshold, and wherein a value of the predefined threshold depends on the mitigation action.

9. The battery management system of claim 7, wherein the one or more processors are further programmed to generate the machine learning determination responsive to receiving the values of the one or more parameters of the battery.

10. The battery management system of claim 7, wherein the machine learning determination is a supervised machine learning determination.

11. The battery management system of claim 7, wherein the one or more parameters of the battery include capacity or internal resistance.

12. The battery management system of claim 7, wherein the one or more parameters of the battery include weight.

13. The battery management system of claim 7, wherein the one or more processors are in the vehicle.

14. A method comprising:
causing a mitigation action for a vehicle to be implemented responsive to a machine learning determination that values of one or more parameters of a battery of the vehicle for a particular time in service match values of one or more parameters of a set of batteries for a same time in service with a level of confidence that exceeds a predefined threshold.

15. The method of claim 14, wherein a value of the predefined threshold depends on the mitigation action such that different mitigation actions have different corresponding predefined thresholds.

16. The method of claim 14, wherein the mitigation action is deactivation of stop-start functionality or a reduction in on-time for accessory loads while the vehicle is parked.

17. The method of claim 14 further comprising outputting an alert for the vehicle responsive to the level exceeding the predefined threshold.

18. The method of claim 17 further comprising precluding output of the alert responsive to the level not exceeding the predefined threshold.

19. The method of claim 14, wherein the machine learning determination is a supervised machine learning determination.

20. The method of claim 14, wherein the values of the one or more parameters of the set are indicative of an aging of the batteries of the set.

* * * * *